(12) United States Patent
Adams et al.

(10) Patent No.: US 6,504,344 B1
(45) Date of Patent: Jan. 7, 2003

(54) MONITORING BATTERY PACKS

(76) Inventors: William Adams, 2890 Donnelly Drive, Kemptville, Ontario (CA), K0G 1J0; James Dunn, 23 Lapointe Blvd., Embrum, Ontario (CA), K0A 1W0

( * ) Notice: Subject to any disclaimer, the term of this patent is extended or adjusted under 35 U.S.C. 154(b) by 0 days.

(21) Appl. No.: 09/668,066

(22) Filed: Sep. 25, 2000

Related U.S. Application Data

(63) Continuation-in-part of application No. 08/887,844, filed on Jul. 3, 1997, now Pat. No. 6,239,579.

(51) Int. Cl.[7] .......................... H02J 7/00; G01N 27/416
(52) U.S. Cl. ........................................ 320/132; 324/427
(58) Field of Search ................................ 320/124, 134, 320/130, 131, 162, 149; 324/428, 427, 429, 433

(56) References Cited

U.S. PATENT DOCUMENTS

| | | | | |
|---|---|---|---|---|
| 4,616,170 A | * | 10/1986 | Urstoger | 320/119 |
| 5,153,496 A | * | 10/1992 | Laforge | 320/119 |
| 5,594,318 A | * | 1/1997 | Nor et al. | 320/106 |
| 5,710,503 A | * | 1/1998 | Sideris et al. | 324/431 |
| 6,184,656 B1 | * | 2/2001 | Karunasiri et al. | 320/119 |
| 6,239,579 B1 | * | 5/2001 | Dunn et al. | 320/121 |

* cited by examiner

*Primary Examiner*—Gregory Toatley
(74) *Attorney, Agent, or Firm*—Harold C. Baker; Robert A. Wilkes; Robert G. Hendry

(57) ABSTRACT

The invention relates to a device for managing battery packs by measuring and monitoring the operating capacity of individual battery modules in a battery pack. A programmable logic controller directs the selective closing of relays to allow individual battery modules to be load-tested using a variable discharge load unit, without compromising useful battery pack capacity. A battery module whose useful capacity falls below a predefined threshold may be connected to a battery charger for replenishment and then electrically realigned with the remaining modules in the pack for continued operation. Alternatively, an alarm may be triggered which alerts the user that the module is due for replacement. This sequence of events is performed on all cells in the pack at a predetermined interval.

20 Claims, 5 Drawing Sheets

BRIDGED CONNECTION
FLOWCHART

MONITORING BATTERY PACKS

This application is a continuation-in-part application of U.S. application serial No. 08/887,844 filed Jul. 3, 1997. U.S. Pat. No. 6,239,579

FIELD OF THE INVENTION

The present invention relates to a device for directly monitoring, assessing and managing the useful capacity and health of batteries.

The current interest and surge in both emission-free electric vehicles communications and information technology has fuelled research and development in not only these fields but those which support them as well. One field in which research and development has increased is battery technology. Current communications devices, such as cellular telephones and PCS (Personal Communication System) units all require rechargeable battery packs. Similarly, today's new information devices, such as PDA's (Personal Digital Assistants), notebook computers, and palmtops also require batteries. This has led to a unique situation—all of these devices need battery management systems which can not only provide the end user with an indication of the battery's remaining life but can also condition the battery so that it will last longer. Likewise, electric transportation has a need for rechargeable batteries for hybrid and battery based propulsion systems which also require battery management systems.

Battery users currently have no accurate means for determining the useful capacity of batteries. Conventional devices measure voltage, impedance, electrolyte specific gravity or other battery characteristics, but do not provide the user with direct information concerning the length of time the battery will operate under load.

A battery management system which can provide a cell or module based technique to maintain and enhance the performance of the battery pack without requiring that the battery pack be disconnected from the load or from the charging system is a major unfilled requirement.

SUMMARY OF THE INVENTION

The present invention addresses these problems by providing a device for directly assessing the useful capacity of a battery while maintaining and enhancing the battery performance of a rechargeable battery such as duration of operation under load.

This objective is achieved by performing an individual assessment of each module of a battery pack. Where used in this specification, the term "module" means one or more electrochemical cells.

A further advantage of the present invention arises from its capability to rejuvenate or boost the health of a battery module of all battery chemistries, e.g. nickel/cadmium. The selectable discharge/charge sequence which is carried out in order to assess and monitor the useful capacity of the module, also serves to enhance the capacity of the module in subsequent cycles.

In a first embodiment the present invention provides a system for determining the health of a rechargeable battery pack, said battery pack consisting of plurality of battery modules, said system comprising:

a variable discharge load for discharging a battery module;

a module charger for providing a selectable charging process for a battery module;

a controller for controlling a network of switches;

a battery module sensor system for measuring a characteristic of a battery module which operates on all modules during any battery pack operation such as pack discharge or recharge; and a network of switches controlled by the controller, said network adapted to operatively couple each module to:
the discharge load;
the module charger; and
the module sensor system, an expert system for controlling the controller, said expert system receiving an output of the module sensor system, means for outputting said characterization wherein said controller discharges and recharges each individual battery module by connecting said battery module to either the discharge load or the module charger using said network of switches; and the expert system determines the useful capacity and characterizes the health of each module based on said characteristic of each module.

In a second embodiment the present invention provides a rechargeable battery pack having a system for determining a useful capacity of said pack, said pack comprising:

a discharge load for discharging one of said battery modules;

a module charger for charging one of said battery modules;

a controller for controlling a network of switches;

a battery module sensor for measuring a characteristic of a battery module which operates at all times of battery pack use; and a network of switches controlled by the controller, said network being capable of operatively coupling each module to:
the discharge load;
the module charger; and
the module sensor, an expert system for controlling the controller, said expert system receiving an output of the module sensor, means for outputting said characteristic, wherein said controller discharges and recharges each individual battery module by connecting said battery module to either the discharge load or the module charger using said network of switches; and the expert system determines the useful capacity of each module based on said characteristic of each module.

In a third embodiment the present invention provides a method for determining the health of a battery pack composed of a plurality of battery modules, said method comprising:

a) selecting a battery module to be tested;
b) electrically isolating the selected module to be tested using a network of switches;
c) coupling the selected battery module to:
a discharge load;
at least one module sensor;
d) performing at least one test which determines a useful capacity of the selected battery module based on predetermined criteria;
e) discharging the selected battery module;
f) coupling the selected battery module to a module charger; and
g) recharging the selected battery module.

The invention may be used in conjunction with any device or system which is battery-powered, or which uses a battery pack as an alternative or back-up power source, such as mobile electronic equipment battery packs used in cellular telephones, computers, camcorders; computers; telecommunication or station batteries; and portable test equipment.

DESCRIPTION OF THE PREFERRED EMBODIMENT

Figure 1:
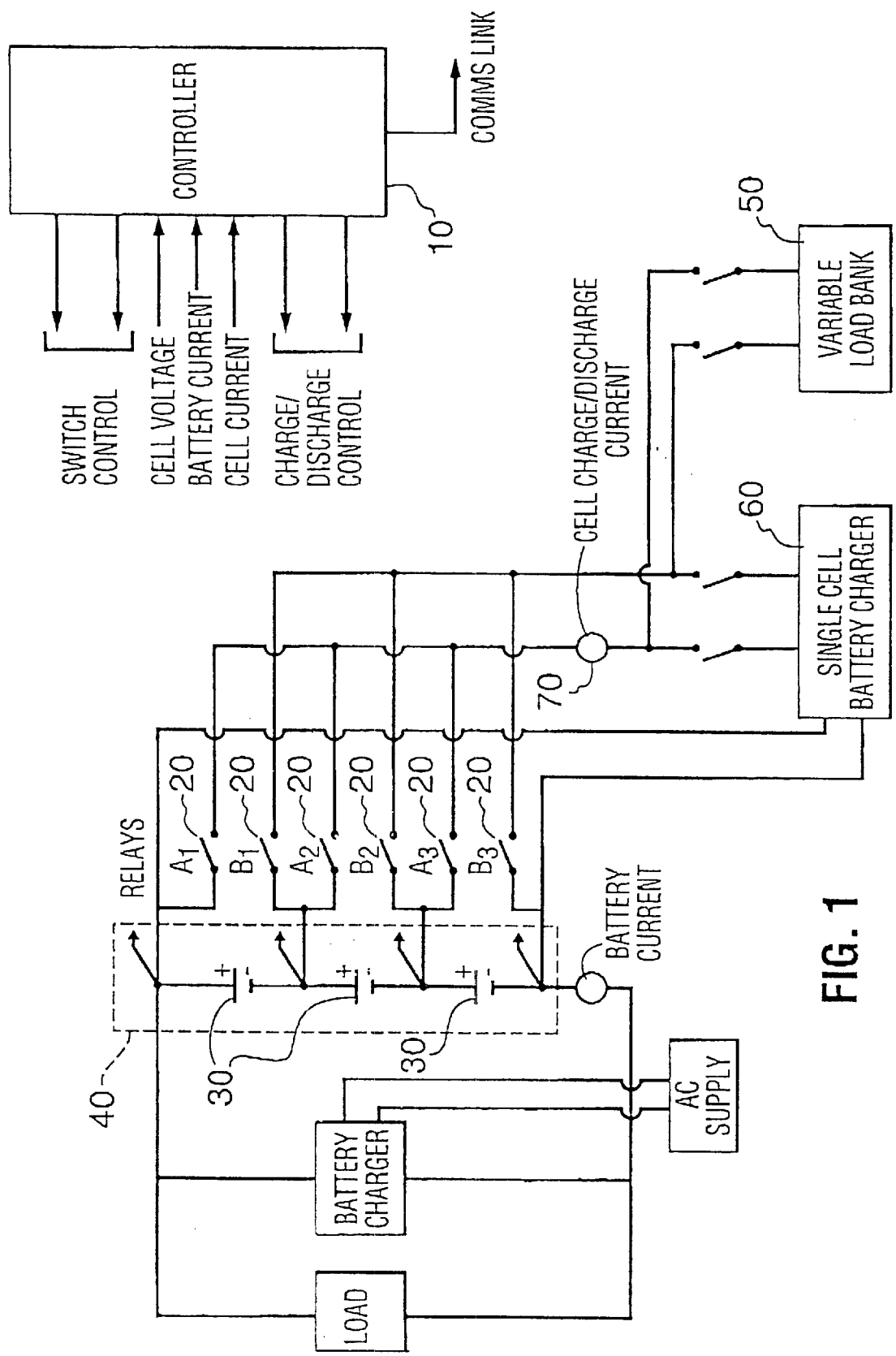
FIG. 1 is a schematic drawing of an embodiment of the invention, depicting a bridged connection circuit with three modules.

Referring to FIG. 1, a schematic diagram of an embodiment of the invention is illustrated.

The circuit comprises a programmable logic controller 10 (PLC), coupled to a plurality of multi-pole contactors 20, relays or solid state switching devices. The invention isolates one of the multiple modules 30 in the battery pack 40 by taking the cell out of the trickle/float charge circuit and then performing a discharge of the battery module which drains the energy of the module into variable discharge means 50 such as a fixed resistance heater or similar device at the normal rated load capacity for that module. The PLC 10 then records which module is being discharged, and how long it takes to discharge to a pre-programmed cut-off voltage. This information is then used to calculate how much energy the module was able to deliver under actual loaded conditions, thereby providing a real measure of its useful capacity. The information on module capacity is provided by way of a liquid crystal display, or similar means, and is given in watt-hours, ampere-hours; % of "as new" or the time to failure under load in minutes, whichever is required by the end user. When the measured capacity falls below a pre-defined threshold an alarm will be triggered, signalling the need for battery or module replacement. At the end of the battery module diagnosis/analysis, the battery module charger 60 will then be engaged to recharge the discharged module.

Figure 2:
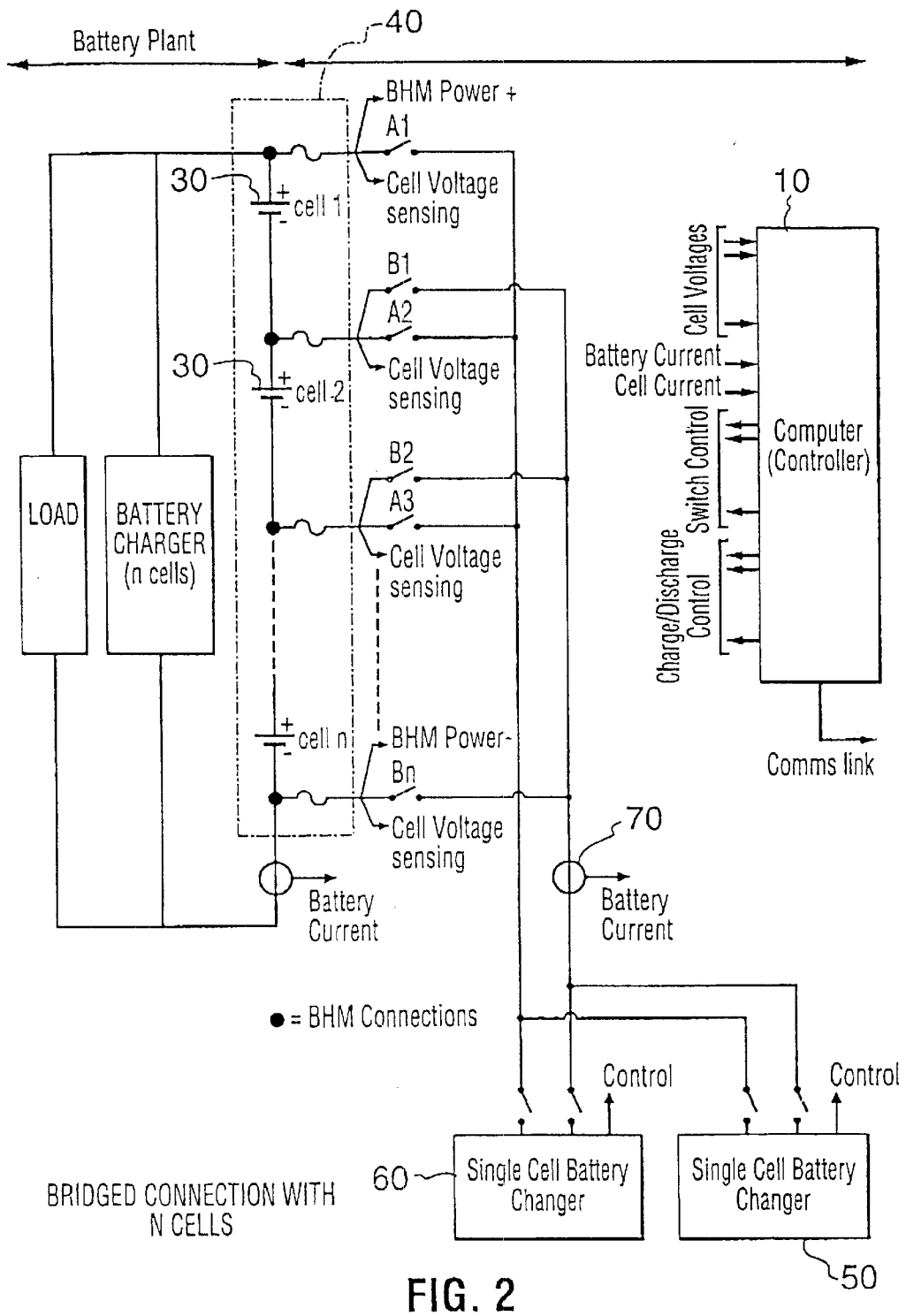
FIG. 2 is a schematic drawing of a further embodiment of the invention, depicting a bridged connection circuit with "n" modules.
Figure 3:
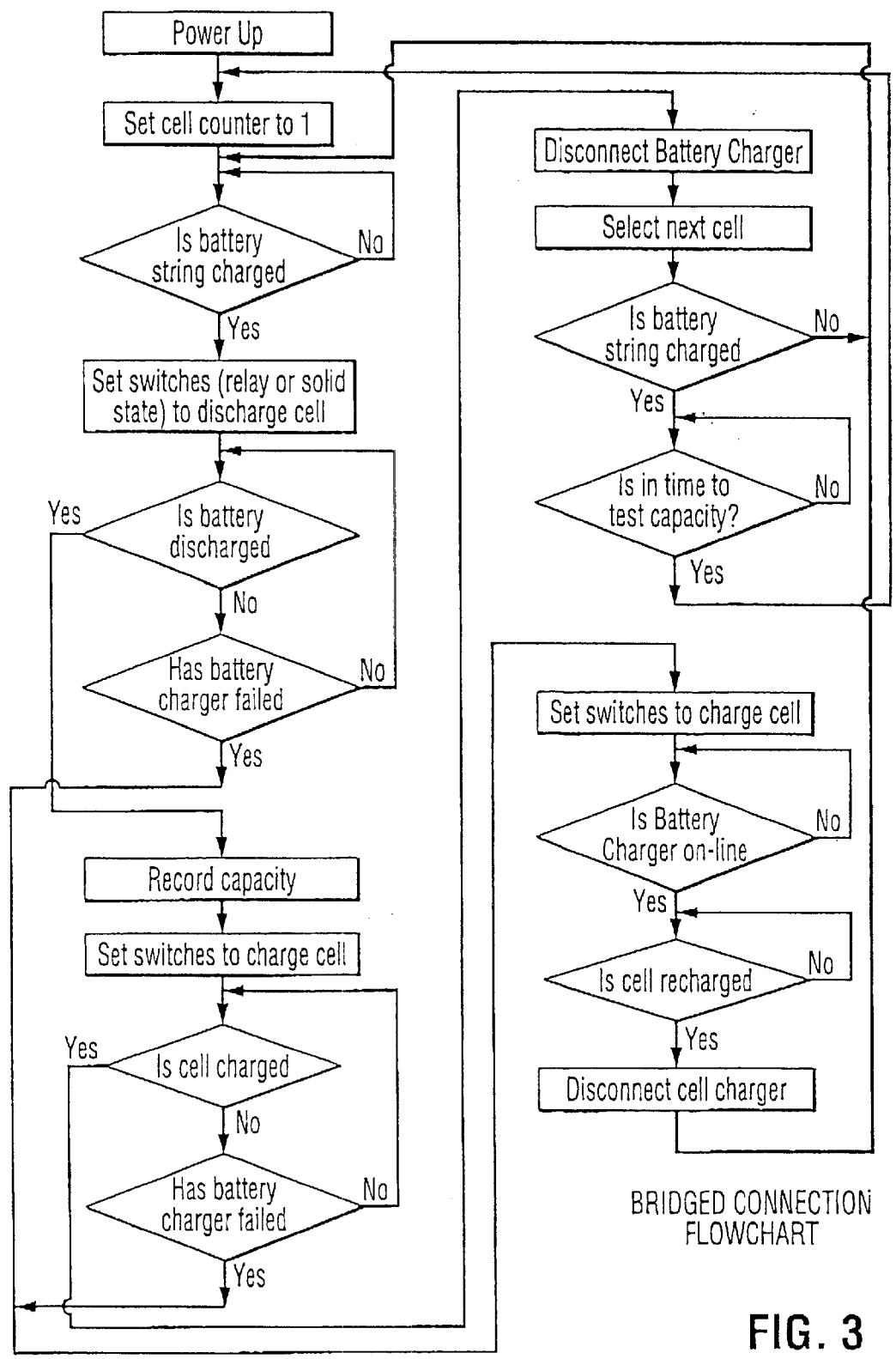
FIG. 3 is a flowchart, schematically depicting operation of the present invention.

The module which is being assessed need not be isolated from the other modules comprising the battery pack. FIGS. 1 and 2 schematically represent a bridged connection. A bridged circuit ensures that the electrical integrity of the battery pack does not have to be broken in order to assess a single module. Using the algorithm outlined in FIG. 3, the capacity of each module is sequentially calculated. The controller controls the opening and closing of isolation relays, the variable discharge load, as well as the module battery charger. Furthermore the controller senses the following: battery pack string current and voltage, selected module charge/discharge current, selected module voltage, ambient temperature, and battery pack and/or module temperatures.

In FIG. 2, the battery pack is shown as operatively connected to a circuit comprising a load and a battery charger which represents the primary power source and load for which the battery pack is intended to provide back up. In order for the operative capacity of the battery pack to be accurately measured, an allowance must be made for the current which flows from the primary power source into the battery pack. Use of Kirchoff's law, where $(+/-i_c)=(+/-i_p)+(+/-i_m)$ where +/- is positive for charge and negative for discharge, $i_c$ is module current, $i_p$ is current of the primary power circuit, and $i_m$ is the current of the monitor device, enables the PLC to accurately and selectively measure the operative capacity of a given module within the battery pack without isolating or disengaging the module from the other modules which comprise the battery pack.

In operation, the controller selectively controls and coordinates the opening and closing of the switches which connect the battery charger and the variable discharge load. Where it is desired to measure the capacity of module or cell 1, isolation relays A1 and B1 are closed by command of the PLC, which then closes the relays which connect the variable discharge load with the battery. The discharge circuit which is thus created enables module or cell 1 to be discharged across the variable discharge load. Module current is measured by a sensor 70 within the circuit and fed back to the PLC. The PLC then causes the relays connecting the variable discharge load to the battery to open, and then closes the relays which connect the battery charger with the battery, thereby defining a charging circuit which recharges module 1 up to a threshold level which is consistent with the useful capacity of the other modules within the string. The procedure is then sequentially repeated for the remaining modules 2, 3, . . . n within the string.

Both the variable discharge load and battery charger output are adjusted according to the ambient battery and module temperature present to prevent battery damage. As well, the computer calculates the a-h (ampere-hour) capacity of each battery cell by integrating the discharge current over the time taken to reach the cut-off voltage threshold, or the energy capacity by the above integration of current times voltage over discharge time in hours. An alternative to using computer control of the variable discharge load and battery charger is direct control using linear circuits.

The means used to discharge the module may use a specific variable discharge profile, constant current, constant resistance, or constant power. The method chosen will depend on the battery technology and the normal usage. To implement these methods, a variable resistor or the like is typically used.

The battery charger used to recharge the module under scrutiny may operate with a variety of algorithms including constant voltage/current, constant power and fast charge methods, including pulse charging.

Figure 4:
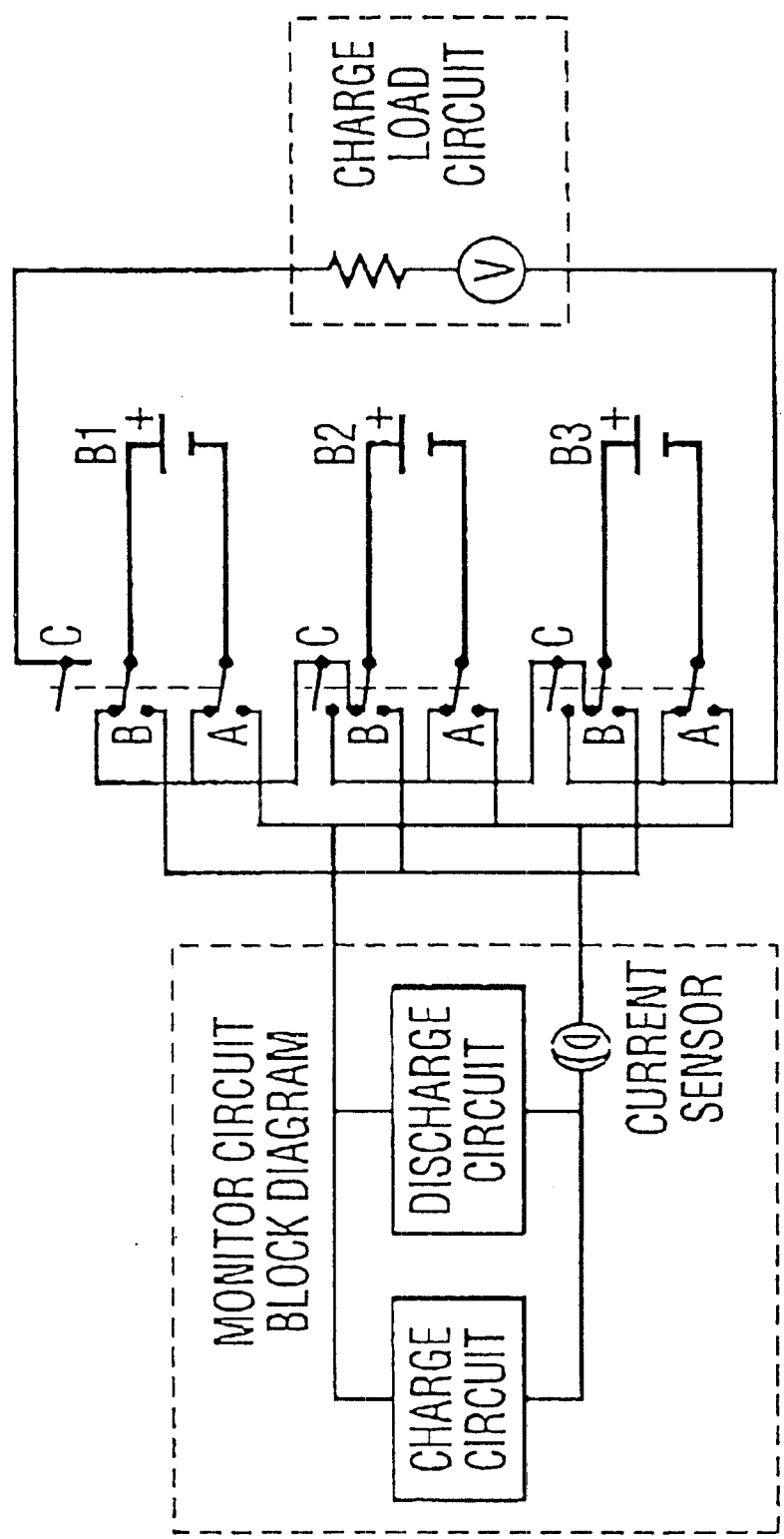
FIG. 4 is a schematic drawing of one embodiment of the invention, depicting an inserted connection circuit.

FIG. 4 depicts an inserted connection circuit. Batteries B1, B2 and B3 operate a charge/load circuit V. Isolation relays or contacts A and B connect an individual module to a monitor circuit, while contact C closes the gap in the battery created by the removal of the module. When relay contact C is closed, the open circuit formed by the removal of the battery module is closed, thereby allowing current to flow through the charge/ load circuit. When isolation relays A, B are closed, an individual battery module can be isolated and connected to the monitor circuit. The monitor circuit discharges the isolated battery module and charges it as required using feedback provided by the current sensor and the preset voltage limits.

As can be seen, any one of the modules in FIG. 4 can be isolated from the rest of the battery for a discharge/recharge cycle. This design which allows individual modules to be isolated can be extended to include the system illustrated in FIG. 5.

Figure 5:
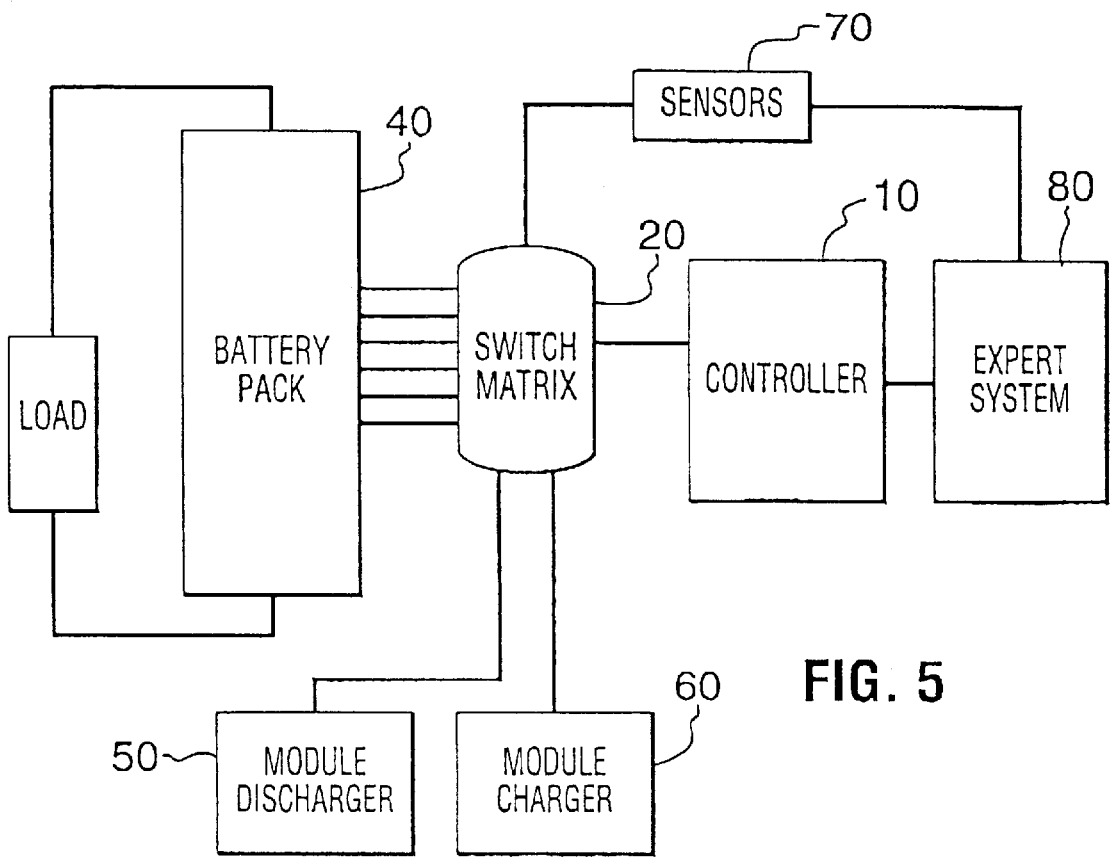
FIG. 5 is a block diagram of another embodiment of the invention incorporating an expert system.
Figure 6:
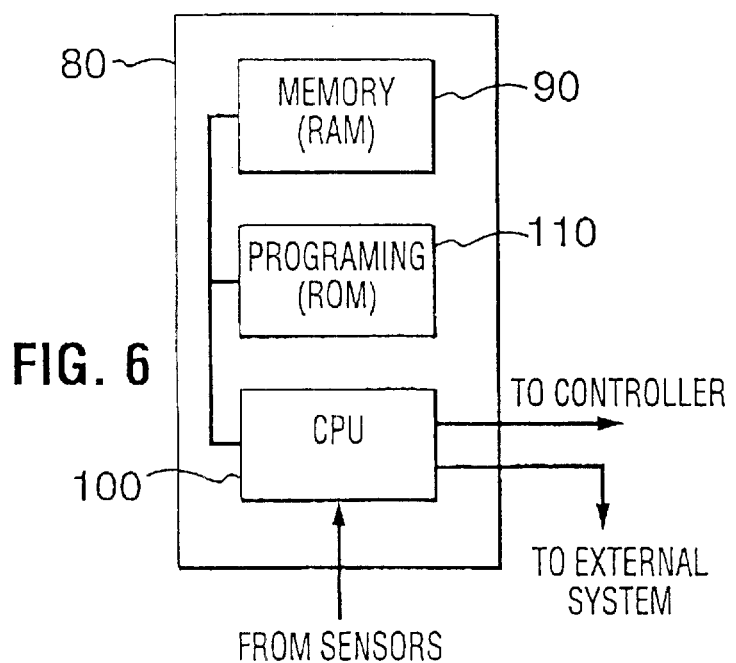
FIG. 6 is a block diagram of an expert system which may be used in the embodiment of FIG. 5.

Referring to FIG. 5, the main elements illustrated in FIGS. 1 and 2 are present. Specifically, switches 30, controller 10 and sensors 70 are present. However, the controller 10 is now coupled to an expert system 80. Expert system 80 is essentially a processing unit which ideally includes memory 90, a Central Processing Unit 100, and programming 110. (See FIG. 6). It should be noted that the expert system 80 may be a self contained unit and may be integrated with the controller 10. In the system of FIG. 5, the controller operates the switch matrix 30 while the expert system 80 controls the controller 10. The controller 10 may operate the switch matrix to continuously check each module in the battery pack. Thus, the controller may poll the modules so that each module is checked in turn by the expert system and the sensor system. In one embodiment, the sensor system is always connected to each of the modules so that the sensor system can continuously check the state of the module. In another embodiment, the sensor system is sequentially coupled to each battery module to sequentially test each module.

The expert system 80 may contain programming (such as a read only memory (ROM)) which allows for different charge/recharge schemes depending on the state of the module under scrutiny.

In one embodiment, for each module being scrutinized, sensor readings are analyzed by the expert system 80. Based on these readings the expert system chooses a charge/recharge sequence which would provide the best results for the module in terms of battery life. As an example, if the sensor readings indicated to the expert system that the module currently being analyzed would benefit from a deep discharge/recharge cycle using a float charge method, the CPU 100 would send signals to the controller 10 to perform the steps for this.

It should also be noted that, if desired, only a special charge/recharge sequence can be provided by the expert system. Thus, in this embodiment, the expert system need not carefully analyze the sensor readings but need only determine that the selected module requires recharging. A sequence optimized for the type of battery module being recharged is then used to recharge the module.

In another embodiment, the expert system can, by keeping track of the performance of each module, determine the general health of the whole battery pack. Based on the amount of current each module can deliver over a specified amount of time (based on the knowledge of the discharger load and how long it took to discharge the module), the expert system can extrapolate how long before the whole battery pack will be devoid of charge. Because of this, the expert system can warn a user via an external system which receives an output of the CPU. The expert system can initiate a countdown based on its estimate of the battery pack capacity and warn the external system before the battery pack runs out of charge.

The expert system may also assess the health of the overall battery pack. Since the expert system knows the state of the individual battery modules, it can determine the total voltage of the battery pack by simply aggregating these values. Depending on the overall voltage found, a determination as to the health of the overall pack can be made. If the overall capacity or voltage is above a predetermined threshold voltage, the pack is judged to be "healthy" and not requiring replacement or recharging. On the other hand, if the pack voltage is below the threshold voltage, the pack is judged to be "unhealthy" and thereby requiring replacement or, at the very least, recharging by the normal process for pack recharging or by the normal process and a special treatment for the module judged by the expert system to be the weakest module.

It should be noted that different charge/recharge methods can be programmed into the expert system. These well known methods can be optimized for whatever type of battery pack is used, whether it be lead acid, nickel cadmium, nickel/metal hydride, or lithium ion cells. The system is effective since it is module based and not pack based.

It should further be noted that the expert system may keep a running counter of the number of charge/recharge cycles for the battery pack as a whole. After a predetermined number of such cycles, since the expert system keeps track of the charge capacity of each module, the expert system could initiate a full module recovery cycle on the module which needed it the most. A full module recovery cycle would be a charge/discharge cycle which would regenerate the module the most, based on the battery type and the charge capacity of the module. The system as described above can be part of an existing device such as a cellular telephone handset, a notebook computer, or an electric vehicle battery. Alternatively, the system could also be integrated into a battery charger which recharges, and in this case, reconditions battery packs. Another possibility is for the system to be integrated into a rechargeable battery pack itself. While this last embodiment may constrain the size of not only the system and of the options available for programming, it would provide better battery management capabilities in terms of warnings regarding failing batteries.

The invention may be used in conjunction with rechargeable batteries of various chemical composition(s). Some are sealed, others are flooded while others are valve-regulated batteries. The typical chemistry of the batteries is nickel/cadmium or lead-acid, nickel/metal hydride, or either lithium ions or lithium polymer. The threshold voltage separating healthy and unhealthy batteries is established having regard to the chemistry of the module. The use of module based charge control becomes very desirable for safety reasons or to avoid irreversible damage in the case of some battery chemistries such as nickel/metal hydride and lithium systems.

It should be noted that the above battery management system can be implemented on a single ASIC (Application Specific Integrated Circuit). The ASIC can contain the controller, the expert system and the switch matrix. It may also optionally contain the battery module recharger. The sensors and the battery module discharger, if desired, can be separate from the ASIC because of their functions. Such an ASIC would be preferable for applications involving small form factor devices such as PDA's, notebook computers and cellular telephones.

In a preferred embodiment, the sensor system continuously provides voltage, current, and temperature of all modules the controller and the expert system. The battery pack is then regularly discharged and charged in the normal sequence of operations. However, for every n discharge/recharge cycles of the battery pack, the expert system checks to see which module has the lowest capacity, based on the sensor system readings. This "weakest" module is, while the battery pack is under going a regular discharge/recharge cycle, isolated by the expert system for diagnosis and "repair". The expert system, based on the readings from the selected module and the type of battery pack, chooses a module recharge sequence or process which will most regenerate the selected module. The selected module, isolated using the network of switches, is then processed by the expert system and the recharger using the recharge sequence or process selected by the expert system. Once this is done, and once the battery pack is recharged, the selected module is reinserted into the pack using the network of switches. This whole process will be repeated again after another n discharge/recharge cycles for the battery pack.

A person understanding the above-described invention may now conceive of alternative designs, using the principles described herein. All such designs which fall within the scope of the claims appended hereto are considered to be part of the present invention.

We claim:

1. A system for determining the health of a rechageable battery pack, said battery pack being composed of plurality of individual battery modules, said system comprising:
    a discharge load for discharging one of said battery modules;
    a module charger for charging one of said battery modules;
    a controller for controlling a network of switches;
    a battery module sensor for measuring a characteristic of a battery module; and
    a network of switches controlled by the controller, said network capable of operatively coupling each module to:
        the discharge load;
        the module charger; and
        the module sensor, an expert system for controlling the controller, said expert system receiving an output of the module sensor, wherein
    said controller discharges and recharges each individual battery module by connecting said battery module to either the discharge load or the module charger using said network of switches; and
    the expert system determines the useful capacity of each module based on said characteristic of each module.

2. A system as in claim 1 wherein said expert system determines total voltage of the battery pack by finding the sum of the individual voltages of each module.

3. A system as in claim 2 wherein said expert system determines a remaining capacity of the pack based on the total voltage of the pack.

4. A system as in claim 1 wherein said expert system measures a discharge time for a module to discharge using said discharge load and said module sensor system.

5. A system as in claim 4 wherein said expert system determines a remaining capacity of the pack based on the discharge times of each of the modules in the pack.

6. A system as in claim 1 wherein said expert system selects an individual module for discharge/recharge based on the useful capacity of said module.

7. A system as in claim 1 wherein said expert system records each instance of a discharge/recharge cycle for each module and selects an individual module for discharge/recharge based on the number of discharge/recharge cycles a module has undergone.

8. A system as in claim 1 wherein said expert system outputs the useful capacity of the battery pack to an external component.

9. A system as in claim 1 wherein said expert system includes:
    storage memory for storing instructions to be executed by the system wherein
    said instructions include processes for different recharge and discharge sequences for different conditions of battery modules.

10. A system as in claim 9 wherein said system uses different discharge and recharge sequences for battery modules based on the type of said battery modules.

11. A rechargeable battery pack having a system for determining a useful capacity of said pack, said pack comprising:
    a discharge load for discharging one of said battery modules;
    a module charger for charging one of said battery modules;
    a controller for controlling a network of switches;
    a battery module sensor for measuring a characteristic of a battery module; and
    a network of switches controlled by the controller, said network capable of operatively coupling each module to:
        the discharge load;
        the module charger; and
        the module sensor, an expert system for controlling the controller, said expert system receiving an output of the module sensor, wherein
    said controller discharges and recharges each individual battery module by connecting said battery module to either the discharge load or the module charger using said network of switches; and
    the expert system determines the useful capacity of each module based on said characteristic of each module.

12. A method for determining the health of a battery pack composed of a plurality of battery modules, said method comprising:
    a) selecting a battery module to be tested;
    b) electrically isolating the selected module to be tested using a network of switches;
    c) coupling the selected battery module to:
        a discharge load;
        at least one module sensor;
    d) performing at least one test which determines a useful capacity of the selected battery module based on predetermined criteria;
    e) discharging the selected battery module;
    f) coupling the selected battery module to a module charger; and
    g) recharging the selected battery module.

13. A method as in claim 12 further including repeating steps a)–g) for each battery module in the battery pack.

14. A method as in claim 12 wherein step d) is performed by an expert system which determines which tests are to be performed on the selected battery module based on at least one criteria chosen from the group comprising:
    a measured condition of the selected battery module;
    a type of the selected battery module; and
    a value stored in a memory of the expert system, said value being related to the health of the selected battery module.

15. An application specific integrated circuit for use with a battery management system for a battery pack composed of multiple battery modules the integrated circuit having the components:

a controller for controlling a network of switches;

a battery module sensor for measuring a characteristic of a battery module in the battery pack; and a network of switches controlled by the controller, said network capable of operatively coupling each module to:
- a discharge load;
- a module charger; and
- a module sensor, an expert system for controlling the controller, said expert system receiving an output of the module sensor, wherein said controller discharges and recharges each individual battery module by connecting said battery module to either the discharge load or the module charger using said network of switches; and the expert system determines the useful capacity of each module based on said characteristic of each module.

16. A battery pack as in claim 11 wherein said expert system selects the weakest battery module during a discharge of the battery pack in normal operating.

17. A battery pack as in claim 11 wherein said controller recharges a selected battery module with a regenerating charge algorithm while the remainder of the modules in the pack received the normal recharge from the module charger.

18. A method as in claim 12 wherein step g) includes recharging the selected battery module with a charge algorithm best suited to a state of the selected module based on a result obtained in step d).

19. A system as in claim 1 wherein said expert system selects an individual module for recharge based on the useful capacity of said module.

20. A system as in claim 1 wherein said expert system records each instance of a recharge cycle for each module and selects an individual module for recharge based on the number of recharge cycles a module has undergone.

* * * * *